United States Patent
Kurokawa

[19]

[11] Patent Number: 5,985,745
[45] Date of Patent: Nov. 16, 1999

[54] METHOD OF FORMING A VIA HOLE FILLED WITH A CONDUCTING MATERIAL, AND SEPARATER FROM A GATE STRUCTURE BY AN INSULATING MATERIAL

[75] Inventor: Atsuo Kurokawa, Kanagawa, Japan

[73] Assignee: Sony Corporation, Tokyo, Japan

[21] Appl. No.: 08/987,390

[22] Filed: Dec. 9, 1997

[30] Foreign Application Priority Data

Dec. 10, 1996 [JP] Japan ..................... 8-329911

[51] Int. Cl.$^6$ ................. H01L 21/3205; H01L 21/4763
[52] U.S. Cl. ................. 438/592; 438/622; 438/637; 438/624; 438/970; 148/DIG. 133
[58] Field of Search ................. 438/622, 624, 438/637, 592, 605, 614, 618, 640, 970; 148/DIG. 133

[56] References Cited

U.S. PATENT DOCUMENTS

| | | |
|---|---|---|
| 4,378,628 | 4/1983 | Levinstein et al. . |
| 4,822,754 | 4/1989 | Lynch et al. . |
| 5,006,484 | 4/1991 | Harada . |
| 5,206,187 | 4/1993 | Doan et al. . |
| 5,362,660 | 11/1994 | Kwasnick et al. . |
| 5,500,080 | 3/1996 | Choi . |
| 5,518,960 | 5/1996 | Tsuchimoto . |
| 5,602,051 | 2/1997 | Cronin et al. . |
| 5,719,071 | 2/1998 | Miller et al. . |
| 5,824,579 | 10/1998 | Subramanian et al. . |
| 5,883,014 | 3/1999 | Chen et al. . |
| 5,895,766 | 4/1999 | Manning . |

*Primary Examiner*—John F. Niebling
*Assistant Examiner*—Jonathan Hack
*Attorney, Agent, or Firm*—Hill & Simpson

[57] ABSTRACT

A semiconductor device fabricating method is capable of securing an increased margin for absorbing an error in aligning a viahole with an underlying wiring layer when forming a viahole in a layer insulating film to connect an upper wiring layer overlying the layer insulating film and a lower wiring layer underlying the layer insulating film to enable the miniaturization of a pattern and the miniaturization of the semiconductor device. The semiconductor device fabricating method forms a first $Si_3N_4$ film between a first wiring layer and a second wiring layer, and a second layer insulating film, a third layer insulating film and a fourth layer insulating film all of $SiO_2$ over the second wiring layer. When forming a third viahole through the layer insulating films so as to reach the second wiring layer, the layer insulating films are etched in a high $SiO_2/Si_3N_4$ selectivity of about twenty. The etching process for forming the third viahole can be terminated on the second wiring layer and the first $Si_3N_4$ film even if the position of the third viahole is dislocated slightly relative to the second wiring layer.

3 Claims, 3 Drawing Sheets

METHOD OF FORMING A VIA HOLE FILLED WITH A CONDUCTING MATERIAL, AND SEPARATER FROM A GATE STRUCTURE BY AN INSULATING MATERIAL

BACKGROUND OF THE INVENTION

The present invention relates to a semiconductor device fabricating method and, more particularly, to a semiconductor device fabricating method for fabricating a semiconductor device of a multilayer wiring construction.

The recent progressive miniaturization of LSI devices (large-scale integrated devices) has increased the importance of the dimensional reduction of repetitive patterns, such as patterns of memory cells. Therefore, pattern size must be reduced securing a margin for absorbing an error in the register of superposed patterns to allow misalignment between the superposed patterns in addition to the reduction of line width, space width and the diameter of contacts by using exposure light of a short wavelength for lithographic processes.

A related art method of fabricating a SRAM (static random-access memory) will be described with reference to FIG. 1 showing a memory cell of a SRAM of a 0.35 μm minimum feature length.

An element isolation oxide film 32 of, for example, a LOCOS (local oxidation of silicon) structure is formed in a pattern on a major surface of a Si (silicon) wafer 31. A gate oxide film 33 is formed on the Si wafer 31 so as to cover element active regions surrounded by the element isolation oxide film 32. Then, a polycide layer, i.e., a laminated layer consisting of a polysilicon layer and a metal silicide layer having a high melting point, serving as a first wiring layer 34 including a gate electrode for a MOS transistor is formed on the gate oxide film 33.

Subsequently, lightly doped regions, not shown, for forming an LDD (lightly doped drain) structure are formed in regions of the surface of the Si wafer 31 on the opposite sides of the first wiring layer 34. Then, side walls 35 of $SiO_2$ are formed on the side surfaces of the first wiring layer 34, and then heavily doped regions which serve as the source and the drain of a MOS transistor are formed.

Then, a first layer insulating film 36 of $SiO_2$ is formed over the entire surface of the Si wafer 31. The first layer insulating film 36 of $SiO_2$ is subjected to selective etching to form a first viahole reaching a heavily doped region forming a ground line or a heavily doped region forming the source or the drain of the MOS transistor. Then, a second wiring layer 39 of a polycide is formed on the first layer insulating film 36 of $SiO_2$ and the second wiring layer 39 is connected through the first viahole to the heavily doped region serving as a ground line and the heavily doped region serving as the source or the drain of the MOS transistor.

Then, a second layer insulating film 40 of $SiO_2$ is formed over the entire surface of the Si wafer 31. The first layer insulating film 36 of $SiO_2$ and the second layer insulating film 40 of $SiO_2$ are subjected to selective etching to form a second viahole for connecting a high-resistance element included in the flip-flop of the SRAM and a heavily doped region serving as a storage node. Then, a third wiring layer 42 including a high-resistance element is formed on the second layer insulating film 40 of $SiO_2$ and the third wiring layer 42 is connected through the second viahole to the heavily doped region serving as a storage node. Subsequently, a third layer insulating film 43 of $SiO_2$ is formed over the entire surface of the silicon wafer 31, and a first $Si_3N_4$ film 44 for keeping the high-resistance element away from moisture is formed on the third layer insulating film 43 of $SiO_2$.

Then, a fourth layer insulating film 45 of $SiO_2$ is formed over the entire surface of the Si wafer 31 and the fourth layer insulating film 45 is subjected to a flattening process. Then, the fourth layer insulating film 45 of $SiO_2$, the first $Si_3N_4$ film 44, the third layer insulating film 43 of $SiO_2$ and the second layer insulating film 40 of $SiO_2$ are etched selectively to form a third viahole for connecting the second wiring layer 39 and the bit line to expose a portion of the second wiring layer 39 in the third viahole. A tungsten plug 48 is formed in the third viahole so as to be connected to the second wiring layer 39. Subsequently, a fourth wiring layer 49 forming a bit line is formed on the fourth layer insulating film 45 of SiO2 so as to be connected to the tungsten plug 48. Finally, an overcoating film 50 is formed over the entire surface of the Si wafer 31.

When forming the third viahole in the fourth layer insulating film 45 of $SiO_2$, the first $Si_3N_4$ film 44, the third layer insulating film 43 of $SiO_2$ and the second layer insulating film 40 of $SiO_2$ formed over the second wiring layer 39 by lithographic techniques by this related art method of fabricating a SRAM, it is possible that the pattern is dislocated relative to the second wiring layer 39 because of the limited pattern registering accuracy of a stepper employed for exposure. Therefore, a portion of the first layer insulating film 36 of $SiO_2$ underlying the second layer insulating film 40 of $SiO_2$ is etched in addition to the foregoing films including the second layer insulating film 40 of $SiO_2$. Consequently, the third viahole penetrates the second wiring layer 39 and reaches the first wiring layer 34 serving as the gate electrode and underlying the second wiring layer 39, and the second wiring layer 39 and the first wiring layer 34 are connected electrically by the tungsten plug 48 formed in the third viahole. Therefore, the lines of the second wiring layer 39 must be formed in a width having a margin to absorb an error in aligning the third viahole with the second wiring layer 39, which imposes a restriction on the miniaturization of the memory cell.

SUMMARY OF THE INVENTION

Accordingly, it is an object of the present invention to provide a semiconductor device fabricating method for fabricating a semiconductor device of a multilayer wiring construction, capable of securing a margin for absorbing an error in aligning a viahole with an underlying wiring layer when forming a viahole in a layer insulating film to connect an upper wiring layer overlying the layer insulating film and a lower wiring layer underlying the layer insulating film to enable the miniaturization of a pattern and the resulting miniaturization of the semiconductor device.

According to one aspect of the present invention, a semiconductor device fabricating method for fabricating a semiconductor device of a multilayer wiring construction comprises steps of forming an insulating film on a semiconductor wafer provided with elements, forming a lower wiring layer on the insulating film, forming a layer insulating film on the lower wiring layer, forming a viahole reaching the lower wiring layer by selectively etching the layer insulating film by an etching process having a higher selectivity for the layer insulating film than for the insulating film, and forming an upper wiring layer so as to be connected through the viahole to the lower wiring layer.

When forming the viahole in the layer insulating film overlying the lower wiring layer by the semiconductor device fabricating method of the present invention, the insulating film is formed under the lower wiring layer, and the layer insulating film is etched selectively by an etching process having a higher selectivity for the layer insulating film than for the insulating film. Therefore, the etching process for forming the viahole in the layer insulating film terminates at the lower wiring layer and the insulating film even if the viahole is dislocated relative to the lower wiring layer and the viahole does not penetrate the insulating film. Accordingly, even if another wiring layer underlies the insulating film, the viahole does not reach the wiring layer underlying the insulating film and the lower wiring layer is not connected through the viahole to the wiring layer underlying the insulating film. Thus, a substantially increased margin for registering the viahole and the lower wiring layer can be secured, and the lithographic process is able to use a pattern of a reduced size, which enables the further miniaturization of the semiconductor device.

If another wiring layer or the like is formed under the insulating film, the insulating film enhances the withstand voltage of a layered structure including the wiring layer and the lower wiring layer, which enhances the reliability of the semiconductor device.

In the semiconductor device fabricating method of the present invention, it is preferable that the insulating film is a silicon nitride film, and the layer insulating film is a silicon dioxide film. The silicon nitride film suppresses the diffusion of moisture contained in the layer insulating film into the element underlying the silicon nitride film, which contributes to the prevention of the deterioration of the characteristics of the semiconductor device and to the enhancement of the reliability of the semiconductor device.

BRIEF DESCRIPTION OF THE DRAWINGS

The above and other objects, features and advantages of the present invention will become more apparent from the following description taken in connection with the accompanying drawings, in which.

DETAILED DESCRIPTION OF THE PREFERRED EMBODIMENT

A semiconductor device fabricating method in a preferred embodiment according to the present invention will be described hereinafter with reference to the accompanying drawings as applied to fabricating a high-resistance load SRAM.

Figure 1:
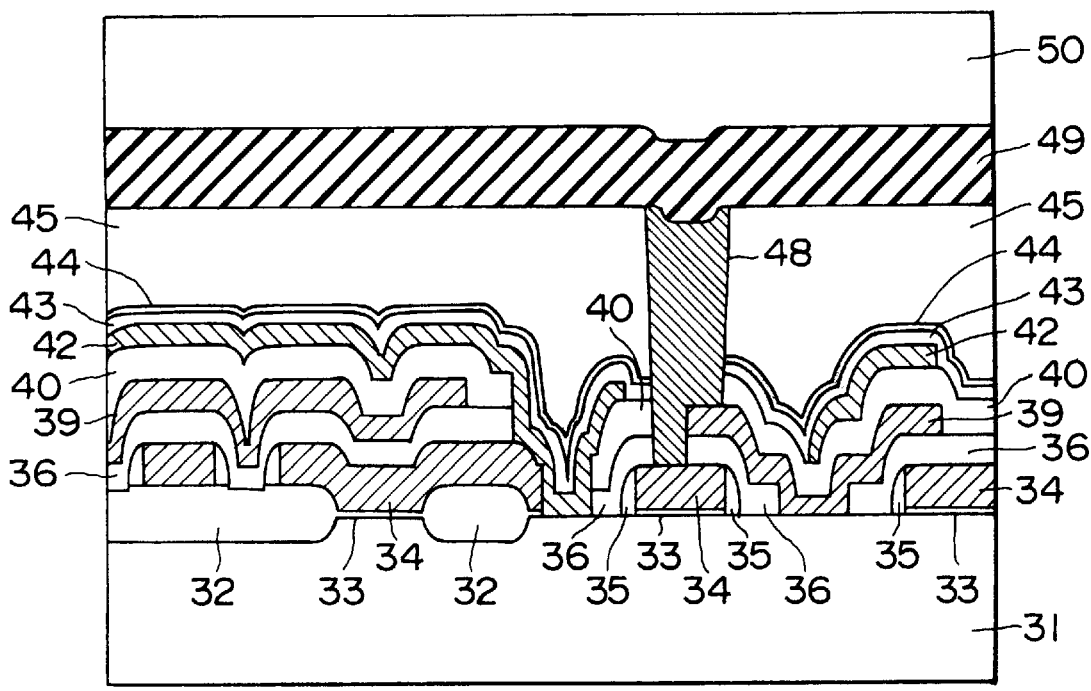
FIG. 1 is a sectional view of a memory cell included in a related art SRAM.
Figure 2:
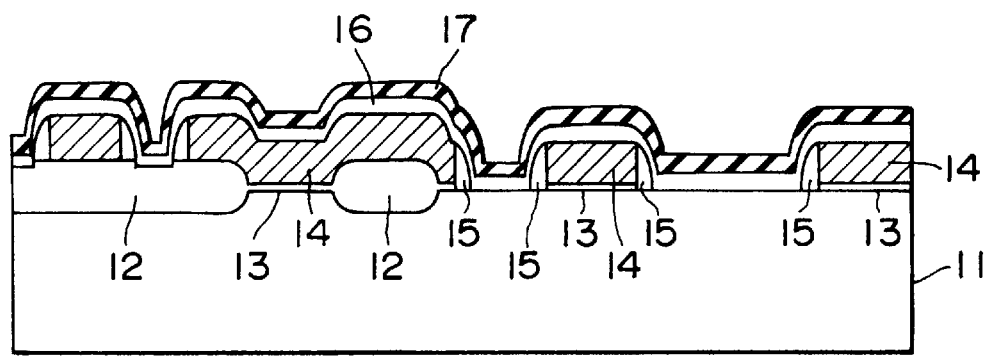
FIG. 2 is a sectional view of a memory cell included in a high-resistance load SRAM in a first stage of a semiconductor device fabricating method in a preferred embodiment according to the present invention.

Referring to FIG. 2, an element isolation oxide film 12 of, for example, a LOCOS construction is formed in a desired pattern on a surface of a Si wafer 11. A gate oxide film 13 is formed on regions of the surface of the Si wafer 11 surrounded by the element isolation oxide film 12. A polysilicon layer and a metal silicide layer having a high melting point are deposited in that order over the entire surface of the Si wafer 11 to form a polycide layer, and then the polycide layer is patterned in a desired pattern to form a first wiring layer 14 serving also as the gate electrode of a MOS transistor is formed on the gate oxide film 13. Subsequently, lightly doped regions, not shown, for forming an LDD structure are formed in regions of the surface of the Si wafer 11 on the opposite sides of the first wiring layer 14 by an ion implantation process using the first wiring layer 14 as a mask. Then, side walls 15 of $SiO_2$ are formed on the side surfaces of the lines of the first wiring layer 14, and then heavily doped regions, not shown, for use as the source and the drain of the MOS transistor are formed by an ion implantation process using the first wiring layer 14 and the side walls 15 of $SiO_2$ as a mask. Then, a first layer insulating film 16 of $SiO_2$ is deposited over the entire surface of the Si wafer 11 by, for example, a CVD process (chemical vapor deposition process). Then, a first $Si_3N_4$ film 17 of about 50 nm in thickness, which characterizes this embodiment, is formed on the first layer insulating film 16 by a CVD process.

Figure 3:
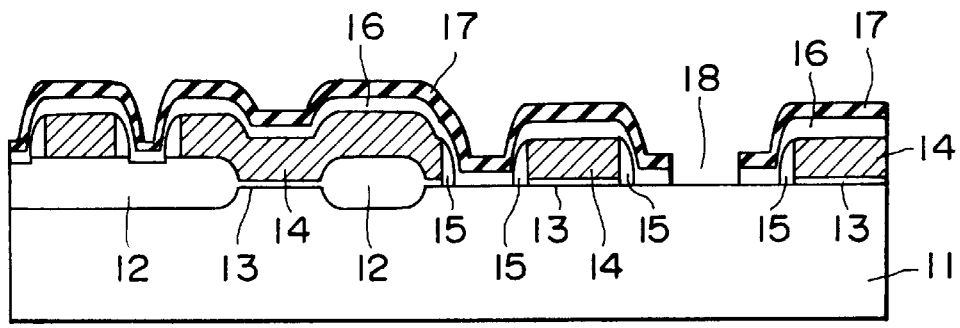
FIG. 3 is a sectional view of the memory cell included in the high-resistance load SRAM in a second stage of the semiconductor device fabricating method in the preferred embodiment according to the present invention.

Referring to FIG. 3, a first viahole 18 reaching the heavily doped region serving as a ground line, or the source or the drain of the MOS transistor is formed through the first $Si_3N_4$ film 17 and the first layer insulating film 16 by the selective etching of the first $Si_3N_4$ film 17 and the first layer insulating film 16.

Figure 4:
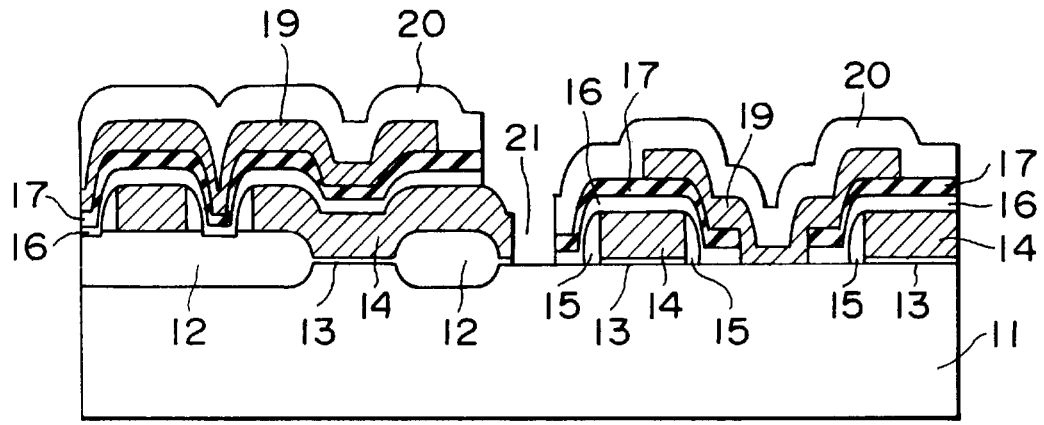
FIG. 4 is a sectional view of the memory cell included in the high-resistance load SRAM in a third stage of the semiconductor device fabricating method in the preferred embodiment according to the present invention.

Referring to FIG. 4, a polysilicon layer and a metal silicide layer having a high melting point are deposited in that order to form a polycide layer over the entire surface of the Si wafer 11, and then the polycide layer is patterned in a desired pattern to form a second wiring layer 19 connected through the viahole 18 to the heavily doped region serving as a ground line, or the source or the drain of the MOS transistor. Subsequently, a second layer insulating film 20 of $SiO_2$ is formed over the entire surface of the Si wafer 11. Then, the second layer insulating film 20, the first $Si_3N_4$ film 17 and the first layer insulating film 16 are subjected to selective etching to form a second viahole 21 for electrically connecting a high-resistance load element included in a flip-flop of the SRAM, and the heavily doped region serving as a storage node.

Figure 5:
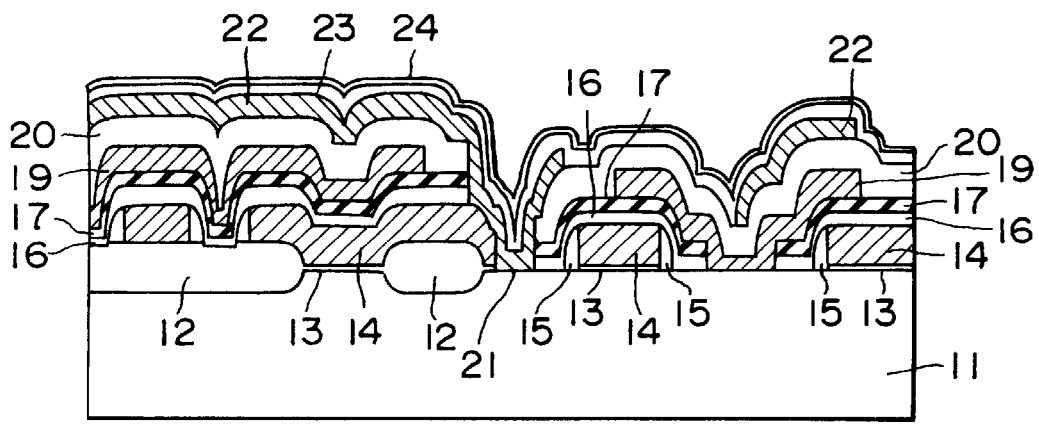
FIG. 5 is a sectional view of the memory cell included in the high-resistance load SRAM in a fourth stage of the semiconductor device fabricating method in the preferred embodiment according to the present invention.

Referring to FIG. 5, a third wiring layer 22 including a high-resistance element is formed on the second layer insulating film 20 so as to be electrically connected through the second viahole 21 to the storage node in the heavily doped region. Subsequently, a third layer insulating film 23 of $SiO_2$ is formed over the entire surface of the Si wafer 11, and a second $Si_3N_4$ film 24 for preventing the diffusion of moisture into the high-resistance element is formed on the third layer insulating film 23.

Figure 6:
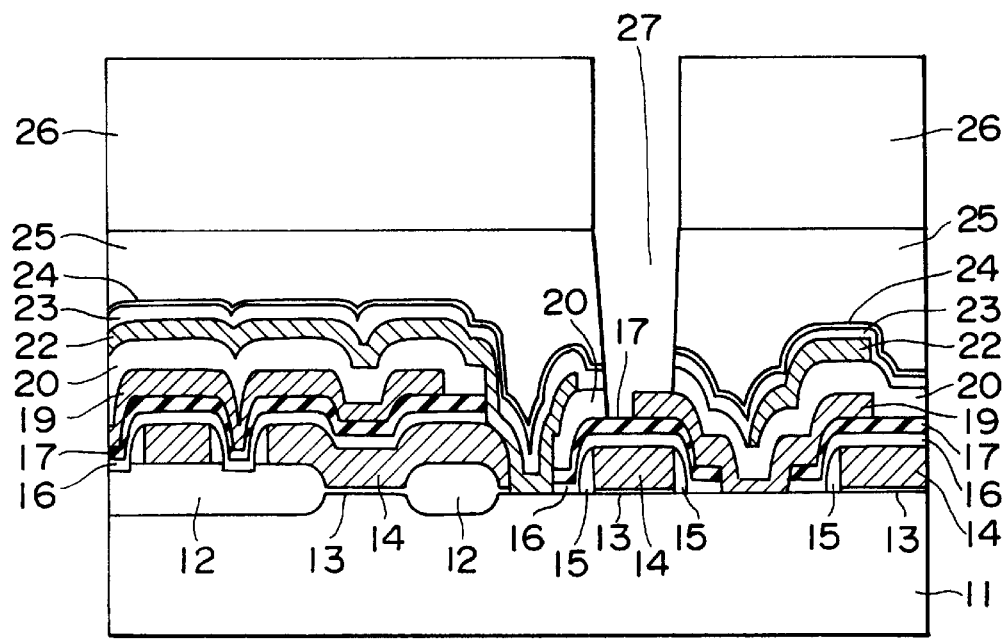
FIG. 6 is a sectional view of the memory cell included in the high-resistance load SRAM in a fifth stage of the semiconductor device fabricating method in the preferred embodiment according to the present invention.

Referring to FIG. 6, a fourth layer insulating film 25 of $SiO_2$ is formed over the second $Si_3N_4$ film 24, and then the surface of the fourth layer insulating film 25 is flattened by a flattening process. A resist film 26 is formed over the flat surface of the fourth layer insulating film 25 and the resist film 26 is patterned in a desired pattern by lithographic techniques. Then, the fourth layer insulating film 25, the second $Si_3N_4$ film 24, the third layer insulating film 23 and the second layer insulating film 20 are etched by a selective etching process using the patterned resist film 26 as a mask to form a third viahole 27 for electrically connecting the second wiring layer 19 and the bit line. A region of the surface of the second wiring layer 19 is exposed in the third viahole 27. When etching the fourth layer insulating film 25, the second $Si_3N_4$ film 24, the third layer insulating film 23 and the second layer insulating film 20 by the selective etching process, a mixed gas of $C_4F_8$ and CO or the like is used as an etching gas so that the $SiO_2/Si_3N_4$ selectivity, i.e., the ratio of the etch rate for $SiO_2$ to the etch rate f or $Si_3N_4$, is about twenty. Accordingly, th e etching process for forming the third viahole 27 terminates on the second wiring layer 19 and the first $Si_3N_4$ film 17 underlying the second wiring layer 19 even if the position of the third viahole 27 is dislocated slightly relative to the second wiring layer 19. Therefore, the second wiring layer 19 is never connected electrically th rough the third viahole 27 to the first wiring layer 14 underlying the first $Si_3N_4$ film 17.

Figure 7:
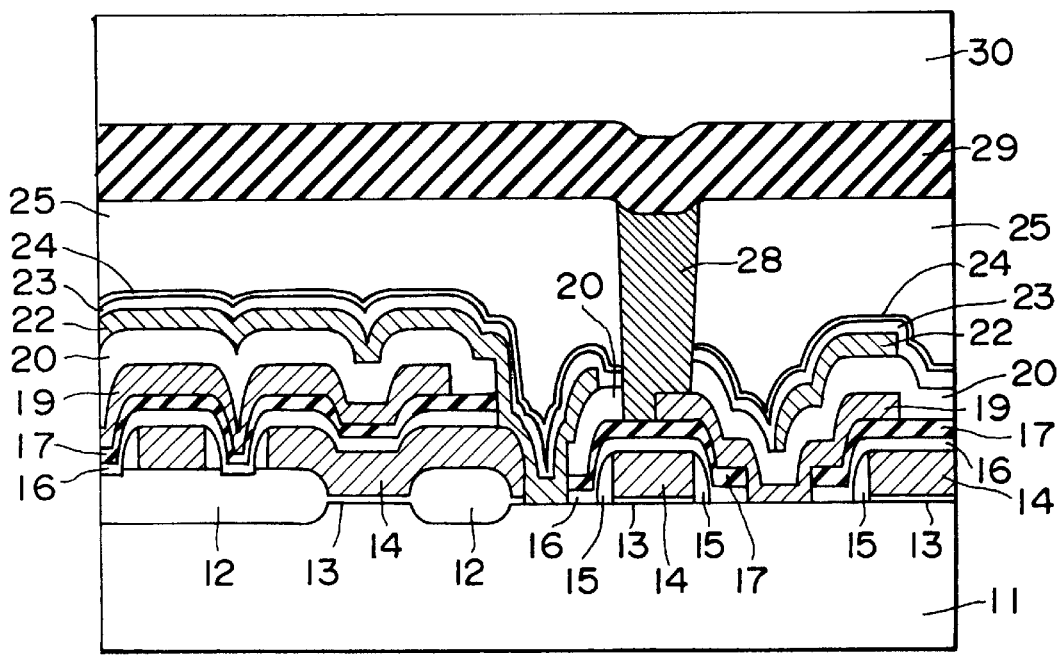
FIG. 7 is a sectional view of the memory cell included in the high-resistance load SRAM in a sixth stage of the semiconductor device fabricating method in the preferred embodiment according to the present invention.

Referring to FIG. 7, the resist film 26 is removed. Then, a Ti/TiN laminated layer is formed over the entire surface of the fourth layer insulating film 25 by, for example, a sputtering process, and a tungsten layer is formed on the Ti/TiN laminated layer so as to fill up the third viahole 27. The Ti/TiN laminated layer and the tungsten layer are etched back so that only a portion of the tungsten layer is left in the third viahole 27 to form a tungsten plug 28 connected to the second wiring layer 19. Subsequently, a Ti/TiN barrier layer, an Al alloy layer and an antireflection film are formed sequentially in that order by, for example, sputtering processes. Then, these layers including the Al alloy layer are patterned in a desired pattern to form a fourth wiring layer 29 forming a bit line connected to the tungsten plug 28 on the fourth layer insulating film 25, and then an overcoating film 30 is formed over the entire surface of the Si wafer 11.

In this embodiment, the first $Si_3N_4$ film 17 is formed between the first wiring layer 14 and the second wiring layer 19, the third viahole 27 reaching the second wiring layer 19 is formed by the selective etching of the second layer insulating film 20 of $SiO_2$, and the third layer insulating film 23 of $SiO_2$ and the fourth layer insulating film 25 of $SiO_2$ are etched in a $SiO_2/Si_3N_4$ selectivity of about twenty. Accordingly, the etching process for forming the third viahole 27 terminates on the second wiring layer 19 and the first $Si_3N_4$ film 17 underlying the second wiring layer 19 even if the position of the third viahole 27 is dislocated slightly relative to the second wiring layer 19. Therefore, the second wiring layer 19 is never connected electrically through the third viahole 27 to the first wiring layer 14 underlying the first $Si_3N_4$ film 17. Thus, a substantially increased margin for registering the third viahole 27 and the second wiring layer 19 can be secured, and the size of the repetitive pattern of the memory cell or the like can be reduced, which enables the further miniaturization of the semiconductor device.

The first $Si_3N_4$ film 17 overlying the first wiring layer 14 suppresses the diffusion of moisture contained in the fourth layer insulating film 25 overlying the first $Si_3N_4$ film 17 into the underlying elements, which contributes to the prevention of the deterioration of the characteristics of the semiconductor device and to the enhancement of the reliability of the semiconductor device.

The first $Si_3N_4$ film 17 formed between the first wiring layer 14 and the second wiring layer 19 enhances the withstand voltage of a layered structure including the first wiring layer 14 and the second wiring layer 19, which improves the characteristics of the semiconductor device and enhances the reliability of the semiconductor device.

Although the present invention has been described as applied to a method of fabricating a high-resistance load SRAM, the present invention is not limited thereto in its practical application; the present invention is applicable, for example, to methods of fabricating all kinds of semiconductor devices including DRAMs of a multilayer construction having viaholes for interconnecting an upper wiring layer and a lower wiring layer.

What is claimed is:

1. A semiconductor device fabricating method for fabricating a semiconductor device of a multilayer wiring construction, said semiconductor device fabricating method comprising steps of:

forming an insulating film on a semiconductor wafer provided with elements;

forming a lower wiring layer on the insulating film;

forming a layer insulating film which is etched at an etch rate higher than that at which the insulating film is etched on the lower wiring layer;

forming a viahole reaching the lower wiring layer by selectively etching the layer insulating film by an etching process; and forming an upper wiring layer so as to be connected through the viahole to the lower wiring layer.

2. The semiconductor device fabricating method according to claim 1, wherein the insulating film is a silicon nitride film, and the layer insulating film is a silicon oxide film.

3. The semiconductor device fabricating method according to claim 1, wherein the etching process for etching the layer insulating film to form the viahole employs a mixed gas of $C_4F_8$ and CO.

* * * * *